(12) United States Patent
Xiao et al.

(10) Patent No.: US 11,387,218 B2
(45) Date of Patent: Jul. 12, 2022

(54) PAD-OUT STRUCTURE FOR SEMICONDUCTOR DEVICE AND METHOD OF FORMING THE SAME

(71) Applicant: Yangtze Memory Technologies Co., Ltd., Hubei (CN)

(72) Inventors: Liang Xiao, Wuhan (CN); Shu Wu, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 0 days.

(21) Appl. No.: 17/127,083

(22) Filed: Dec. 18, 2020

(65) Prior Publication Data

US 2022/0068883 A1 Mar. 3, 2022

Related U.S. Application Data

(63) Continuation of application No. PCT/CN2020/112979, filed on Sep. 2, 2020.

(51) Int. Cl.
  *H01L 25/065* (2006.01)
  *H01L 27/11582* (2017.01)
  *H01L 23/00* (2006.01)

(52) U.S. Cl.
  CPC .......... *H01L 25/0657* (2013.01); *H01L 24/03* (2013.01); *H01L 24/05* (2013.01);
  (Continued)

(58) Field of Classification Search
  CPC ..... H01L 25/0657; H01L 24/03; H01L 24/05; H01L 24/08; H01L 24/89;
  (Continued)

(56) References Cited

U.S. PATENT DOCUMENTS 10,453,854 B2 * 10/2019 Kanno ............. H01L 27/11575
10,629,616 B1 4/2020 Kai et al.
(Continued)

FOREIGN PATENT DOCUMENTS

CN 110249427 A * 9/2019 ............. H01L 24/05
CN 111146202 A 5/2020
(Continued)

OTHER PUBLICATIONS

International Search Report dated May 31, 2021 in PCT/CN2020/112979 (submitting English translation only), 4 pages.

*Primary Examiner* — Mamadou L Diallo
(74) *Attorney, Agent, or Firm* — Oblon, McClelland, Maier & Neustadt, L.L.P.

(57) ABSTRACT

The present disclosure provides a method of fabricating a semiconductor device. The method can include bonding a first die and a second die face to face, the first die including a substrate, transistors formed on a face side of the first die over a semiconductor layer with an insulating layer between the substrate and the semiconductor layer, and a first contact structure on the face side of the first die extending through the insulating layer. The method can also include exposing the first contact structure from the back side of the first die, forming, from the back side of the first die, a contact hole in the insulating layer to expose the semiconductor layer, and forming, on the back side of the first die, a first pad-out structure connected with the first contact structure and a second pad-out structure, on the contact hole, conductively connected with the semiconductor layer.

20 Claims, 5 Drawing Sheets

(52) U.S. Cl.
CPC .............. *H01L 24/08* (2013.01); *H01L 24/89* (2013.01); *H01L 27/11582* (2013.01); *H01L 2224/03002* (2013.01); *H01L 2224/05624* (2013.01); *H01L 2224/05666* (2013.01); *H01L 2224/08145* (2013.01); *H01L 2224/80895* (2013.01)

(58) Field of Classification Search
CPC ..... H01L 27/11582; H01L 2224/03002; H01L 2224/05624; H01L 2224/05666; H01L 2224/08145; H01L 2224/80895
See application file for complete search history.

(56) References Cited

U.S. PATENT DOCUMENTS

| | | | | |
|---|---|---|---|---|
| 10,734,371 | B2* | 8/2020 | Park | H01L 27/11582 |
| 10,804,202 | B2 | 10/2020 | Nishida | |
| 10,903,164 | B2 | 1/2021 | Nishida | |
| 11,043,469 | B1* | 6/2021 | Shih | H01L 24/89 |
| 11,158,622 | B1* | 10/2021 | Zhang | H01L 25/50 |
| 2007/0269998 | A1* | 11/2007 | Daly | H01R 43/0249 439/70 |
| 2009/0127686 | A1* | 5/2009 | Yang | H01L 24/82 257/686 |
| 2012/0043666 | A1 | 2/2012 | Park et al. | |
| 2017/0243650 | A1* | 8/2017 | Ogawa | H01L 27/11556 |
| 2017/0338241 | A1* | 11/2017 | Lee | H01L 29/66833 |
| 2019/0081069 | A1* | 3/2019 | Lu | H01L 27/11573 |
| 2020/0098776 | A1 | 3/2020 | Sugisaki | |
| 2020/0144242 | A1 | 5/2020 | Park | |
| 2020/0203329 | A1* | 6/2020 | Kanamori | H01L 24/05 |
| 2020/0251417 | A1 | 8/2020 | Lee et al. | |
| 2020/0258146 | A1 | 8/2020 | Nishida | |
| 2020/0258904 | A1 | 8/2020 | Kai et al. | |
| 2020/0294918 | A1 | 9/2020 | Nishida | |
| 2020/0303361 | A1* | 9/2020 | Shih | H01L 23/5226 |
| 2020/0350286 | A1* | 11/2020 | Cheng | H01L 24/83 |
| 2020/0357784 | A1 | 11/2020 | Park | |
| 2021/0233893 | A1* | 7/2021 | Greco | H01L 24/45 |

FOREIGN PATENT DOCUMENTS

| | | |
|---|---|---|
| CN | 111566815 A | 8/2020 |
| TW | 202114071 A | 4/2021 |

\* cited by examiner

PAD-OUT STRUCTURE FOR SEMICONDUCTOR DEVICE AND METHOD OF FORMING THE SAME

RELATED APPLICATION

This application is a bypass continuation of International Application No. PCT/CN2020/112979, filed on Sep. 2, 2020. The entire disclosure of the prior application is hereby incorporated by reference in its entirety.

TECHNICAL FIELD

The present application describes embodiments generally related to semiconductor memory devices.

BACKGROUND

Three dimensional (3D) NAND flash memory technology has been developed to achieve higher data storage density without requiring smaller memory cells. A 3D NAND memory device usually includes array transistors that form vertical memory cell strings and peripheral transistors that form peripheral circuits. In a traditional 3D NAND device, array transistors and peripheral transistors are processed on a same substrate. In an Xtacking architecture, however, an array substrate containing array transistors and a peripheral substrate containing peripheral transistors are stacked face to face via a bonding interface, with transistors sandwiched between the two substrates. Hence, the Xtacking architecture can achieve a higher storage density, a simpler process flow, and a shorter cycle time.

The Xtacking architecture can also include pad-out structures on the back side of either the array substrate or the peripheral substrate. External circuitry can therefore provide control signals via the pad-out structures to the transistors sandwiched between the two substrates. Pad-out structures can be manufactured in a through-silicon-contact (TSC) configuration.

SUMMARY

Aspects of the disclosure provide pad-out structures for a semiconductor device of an Xtacking architecture and the method of forming the pad-out structures.

According to a first aspect, a semiconductor device of Xtacking architecture with pad-out structures is disclosed. The semiconductor device can include a first die and a second die bonded face to face. The first die can include an insulating layer on a back side of the first die, a first contact structure extending from the face side of the first die through a first portion of the insulating layer, a semiconductor layer on a face side of a second portion of the insulating layer, and first transistors formed on a face side of the semiconductor layer.

In some embodiments, the first transistors can include memory cells formed over the semiconductor layer on the face side of the first die. The memory cells can include a stack of alternating word line layers and insulating layers, and a plurality of channel structures extending through the stack. In some embodiments, the first die can further a plurality of contact structures formed in a staircase region of the stack, the plurality of contact structures being coupled with the word line layers. The staircase region can be on a boundary or in the middle of the stack. Further, a channel structure can include a channel layer surrounded by one or more insulating layers.

In some embodiments, the second die can include a substrate and peripheral circuitry that is formed on the face side of the substrate for the memory cells.

The semiconductor device can also include a first pad-out structure disposed on the back side of the first die, where the first pad-out structure is electrically coupled with the first contact structure. The semiconductor device can further include a second pad-out structure disposed on the back side of the first die, where the second pad-out structure is electrically coupled with the semiconductor layer via a contact hole, and the second pad-out structure fills the contact hole.

The first pad-out structure can include a first portion of a first conductive layer, and the second pad-out structure can include a second portion of the first conductive layer. The first portion of the first conductive layer can be spaced apart from the second portion of the first conductive layer. The first conductive layer can be made of a first metal material. In some embodiments, the first pad-out structure can further include a first portion of a second conductive layer disposed between the first contact structure and the first pad layer. The second pad-out structure can further include a second portion of the second conductive layer disposed between the semiconductor layer and the second pad layer. The first portion of the second conductive layer can be spaced apart from the second portion of the second conductive layer. The second conductive layer can be made of a second metal material. In an example, the first metal material is made of aluminum, and the second metal material is made of titanium.

In some embodiments, the first pad-out structure can be coupled with an input/output circuit of the peripheral circuitry via the first contact structure, a bonding interface between the first die and the second die, and a corresponding second contact structure in the second die. The peripheral circuitry can be coupled with the memory cells via corresponding third contact structures in the first die, the bonding interface, and corresponding fourth contact structures in the second die. The second pad-out structure can be configured to provide an array common source for the memory cells.

In alternative embodiments, the second die can further include memory cells formed on the face side of the substrate, and the first transistors can include peripheral circuitry, formed on the face side of the substrate, for the memory cells. Further, the first pad-out structure can be coupled with an input/output circuit of the peripheral circuitry via the first contact structure, and the peripheral circuitry can be coupled with the memory cells via corresponding contact structures in the first die, a bonding interface between the first die and the second die, and corresponding contact structures in the second die.

According to a second aspect of the disclosure, a method for fabricating a semiconductor device of an Xtacking architecture having pad-out structures is provided. The method can include bonding a first die and a second die face to face, where the first die includes a first substrate, an insulating layer on a face side of the first substrate, a first contact structure on the face side of the first die extending through a first portion of the insulating layer, and a semiconductor layer on a face side of a second portion of the insulating layer.

In some embodiments, the first die can further include memory cells formed on the face side of the semiconductor layer, and the second die can include peripheral circuitry for the memory cells on a face side of a second substrate. In some embodiments, bonding the first die and the second die face to face can further include bonding a first bonding structure connected with the first contact structure in the first die with a second bonding structure connected to an input/output circuit in the peripheral circuitry in the second die.

In alternative embodiments, the second die can include memory cells disposed on the face side of the second die, and the first die can further include peripheral circuitry for the memory cells.

The method can also include exposing the first contact structure from the back side of the first die by removing the first substrate from a back side of the first die. In some embodiments, the method can include removing an etch stop layer after removing the first substrate, wherein the etch stop layer is sandwiched between the first substrate and the insulating layer.

The method can further include forming, from the back side of the first die, a contact hole in the second portion of the insulating layer, wherein the contact hole exposes the semiconductor layer, and forming, on the back side of the first die, a first pad-out structure conductively connected with the first contact structure and a second pad-out structure on the contact hole that is conductively connected with the semiconductor layer. In some embodiments, the second pad-out structure can be configured to provide an array common source for the memory cells.

Further, forming the first pad-out structure and the second pad-out structure can include forming, from the back side of the first die, a first conductive layer over the first contact structure and the semiconductor layer, and the first conductive layer fills the contact hole, and patterning, from the back side of the first die, the first conductive layer to form the first pad-out structure conductively connected with the first contact structure and the second pad-out structure conductive connected with the semiconductor layer. In some embodiments, a second conductive layer can be formed on a back side of the insulating layer where the second conductive layer interfaces the first conductive layer and the first contact structure and interfaces the first conductive layer and the semiconductor layer, and the second conductive layer is patterned using a same photomask as the first conductive layer.

In some embodiments, the first conductive layer can be made of a first metal material, and the second conductive layer can be made of a second metal material. In an example, the first conductive layer includes at least titanium, and the second conductive layer includes at least aluminum.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

DETAILED DESCRIPTION

Figure 1:
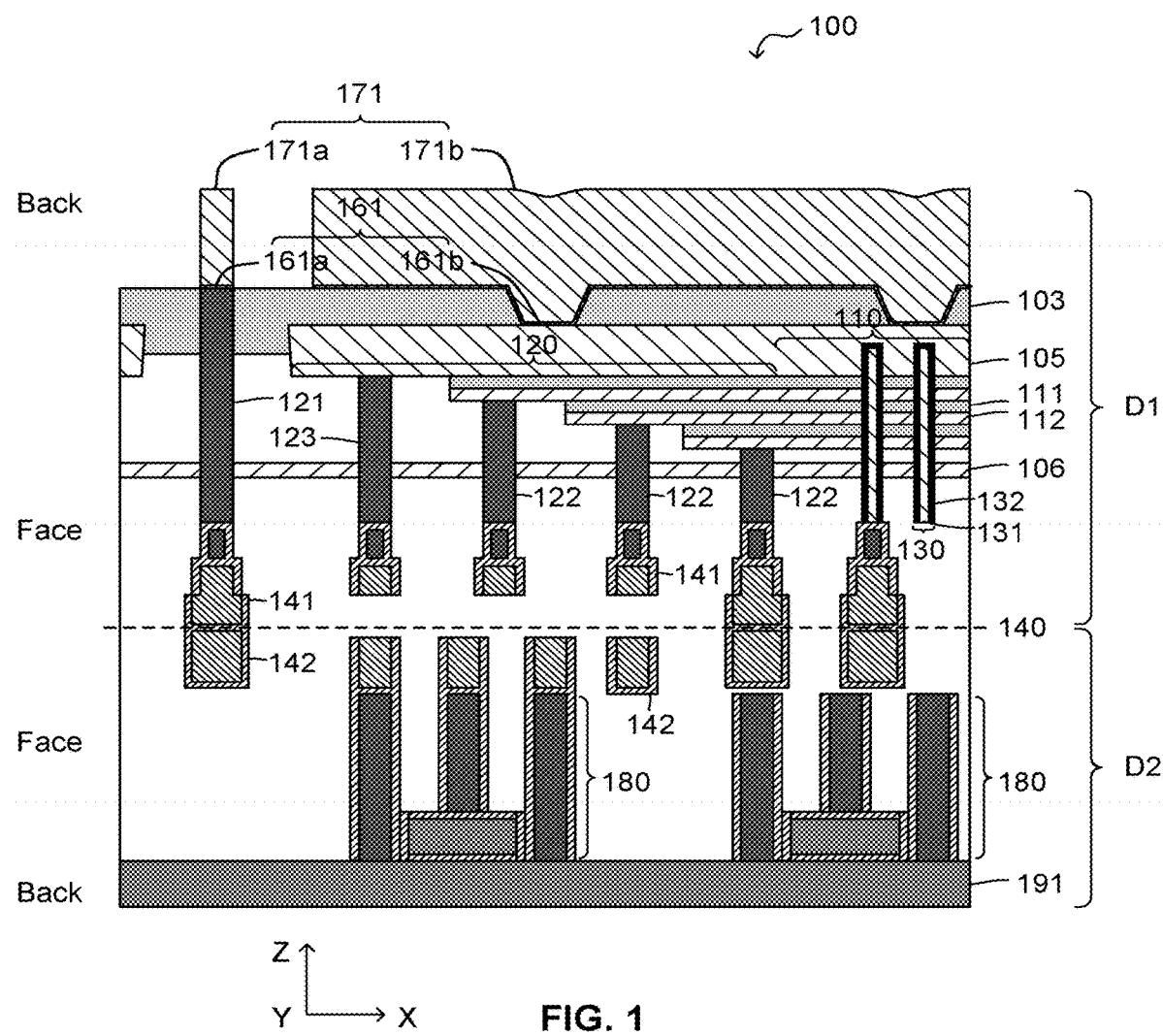
FIG. 1 is a cross-sectional view of a semiconductor device, in accordance with exemplary embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features may be in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides a method of forming pad-out structures for a 3D memory device of an Xtacking architecture. The method can include bonding a first die and a second die, removing a substrate of the first die, forming a contact hole, and forming pad-out structures. Compared with through-silicon-contact (TSC) pads for an Xtacking architecture, the disclosed method eliminates the need for deposition and etching of additional dielectric layers and TSC metals, therefore simplifying the manufacturing process.

FIG. 1 is a cross-sectional view of a semiconductor device 100, in accordance with exemplary embodiments of the disclosure. As illustrated, the device 100 can include a first die D1 and a second die D2 bonded together via a bonding interface 140 in a face-to-face fashion (a circuitry side is face, and a substrate side is back). The first die D1 and the second die D2 can respectively include bonding structures 141 and 142 that are correspondingly aligned with each other. Further, a bonding structure 141 can be electrically coupled with a corresponding bonding structure 142.

As shown in FIG. 1, the first die D1 can include an insulating layer 103 (e.g., silicon oxide), a semiconductor layer 105 (e.g., doped polysilicon) on the face side of the insulating layer 103, and a first contact structure 121 (e.g., tungsten) that is formed on the face side of and extends through the insulating layer 103.

The first die D1 can also include 3D NAND memory cells. For example, a stack of alternating insulating layers 111 and word line layers 112 (also referred to as gate layers) can be disposed on the face side of the semiconductor layer 105. The stack can include an array region 110 where at least one channel structure 130 is formed and extends through the stack into the semiconductor layer 105. The stack of insulating layers 111 and word line layers 112 and the channel structure 130 can form a stack of transistors, such as an array of vertical memory cell strings. In some examples, the stack of transistors can include memory cells and select transistors, such as one or more bottom select transistors, one or more top select transistors, and the like. In some examples, the stack of transistors can also include one or more dummy select transistors.

The insulating layers 111 can be made of insulating material(s), such as silicon nitride, silicon dioxide, and the like. The word line layers 112 can be made of gate stack materials, such as high dielectric constant (high-k) gate insulator layers, metal gate electrode, and the like. The channel structure 130 can include a channel layer 131 (e.g., polysilicon), surrounded by one or more insulating layers 132, such as a tunneling layer (e.g., silicon oxide), a charge trapping layer (e.g., silicon nitride), and a barrier layer (e.g., silicon oxide) that together form an oxide-nitride-oxide structure surrounding the channel layer 131.

Further, the stack can have a staircase region 120 where a plurality of second contact structures 122 and a third contact structure 123 are formed. The second contact structures 122 are connected to the word line layers 112 that can function as gates and dummy gates of the vertical memory cell strings. The third contact structure 123 is connected to the semiconductor layer 105. Note that the device 100 can have various staircase configurations, such as center staircase implementation, side staircase implementation, and the like.

Still in FIG. 1, the first die D1 can further include a first conductive layer 171 (also referred to as a pad layer) on a back side of a second conductive layer 161 (also referred to as a liner layer) that has a first portion 161a covering the back side of the first contact structure 121 and a second portion 161b covering a hole of the insulating layer 103. A first portion of the first conductive layer 171a and a second portion of the first conductive layer 171b can be disposed on the back side of the first and second portions of the second conductive layer 161a and 161b, respectively, to form a first pad-out structure and a second pad-out structure. The first portion of the first conductive layer 171a can be electrically coupled with the first contact structure 121, and the second portion of the first conductive layer 171b can be electrically coupled with the semiconductor layer 105. In this example, the first conductive layer 171 is aluminum, and the semiconductor layer 105 is polysilicon. The second conductive layer 161 can be an adhesion layer, such as a titanium layer with a thickness in the range of 10-20 nm, disposed between aluminum and polysilicon. In some embodiments, the second conductive layer 161 may be formed of a titanium silicide under a relatively high temperature (e.g., above 500° C.). In other examples, the first conductive layer 171 can be made of other conductive materials, and the second conductive layer 161 can be a barrier layer, a seed layer, and/or an adhesion layer. The second conductive layer 161 can also be used to reduce contact resistance. In some embodiments, the second conductive layer 161 may not be necessary.

In the FIG. 1 example, the first die D1 can include 3D memory cells, and the second die D2 can include peripheral circuitry (e.g., address decoder, driving circuits, sense amplifier, and the like). Generally, the peripheral circuitry of the second die D2 can interface the memory cells with external circuitry. For example, the peripheral circuitry receives instructions from the external circuitry via the first pad-out structure (171a and 161a), provides control signals to the memory cells, receives data from the memory cells, and outputs data to the external circuitry via the first pad-out structure (171a and 161a). Further, in some embodiments, the semiconductor layer 105 is coupled to an array common source (ACS) for a memory cell array so the second pad-out structure (171b and 161b) can provide input/output pad-out structure for ACS.

For simplicity, a substrate 191 and two transistors 180 formed thereon are shown in the second die D2. For example, the transistors 180 can form a complementary metal oxide semiconductor (CMOS). The substrate 191 can be any suitable substrate, such as a silicon (Si) substrate, a germanium (Ge) substrate, a silicon-germanium (SiGe) substrate, and/or a silicon-on-insulator (SOI) substrate. The substrate may include a semiconductor material, for example, a Group IV semiconductor, a Group III-V compound semiconductor, or a Group II-VI oxide semiconductor. The Group IV semiconductor may include Si, Ge, or SiGe. The substrate 191 may be a bulk wafer or an epitaxial layer. Nota that the first die D1 initially includes a substrate, on which the semiconductor layer 105 and the insulating layer 103 are disposed. The substrate is removed prior to the formation of the pad-out structures (171 and 161).

In some embodiments, a semiconductor memory device can include multiple array dies (e.g., the first die D1) and a CMOS die (e.g., the second die D2). The multiple array dies and the CMOS die can be stacked and bonded together. Each array die is coupled to a portion of the CMOS die, and the CMOS die can drive the array dies individually or together in a similar manner. Further, in some examples, the semiconductor device 100 includes at least a first wafer and a second wafer bonded face to face. The first die D1 is disposed with other array dies like D1 on the first wafer, and the second die D2 is disposed with other CMOS dies like D2 on the second wafer. The first wafer and the second wafer are bonded together so that the array dies on the first wafer are bonded with corresponding CMOS dies on the second wafer.

In alternative embodiments, the first die D1 can include peripheral circuitry, and the second die D2 can include 3D memory cells (not shown). The pad-out structures (171 and 161) can still be disposed on the back side of the first die D1. Since the input/output signals do not need to route through the memory cell array die, the input/output signal paths can be shorter than the signals paths in FIG. 1.

FIGS. 2-9 are cross-sectional views of a semiconductor device, such as the device 100 and the like, at various intermediate steps of manufacturing, in accordance with exemplary embodiments of the disclosure. The device 100 can refer to any suitable device, for example, memory circuits, a semiconductor chip (or die) with memory circuits formed on the semiconductor chip, a semiconductor wafer with multiple semiconductor dies formed on the semiconductor wafer, a stack of semiconductor chips, a semiconductor package that includes one or more semiconductor chips assembled on a package substrate, and the like.

Figure 2:
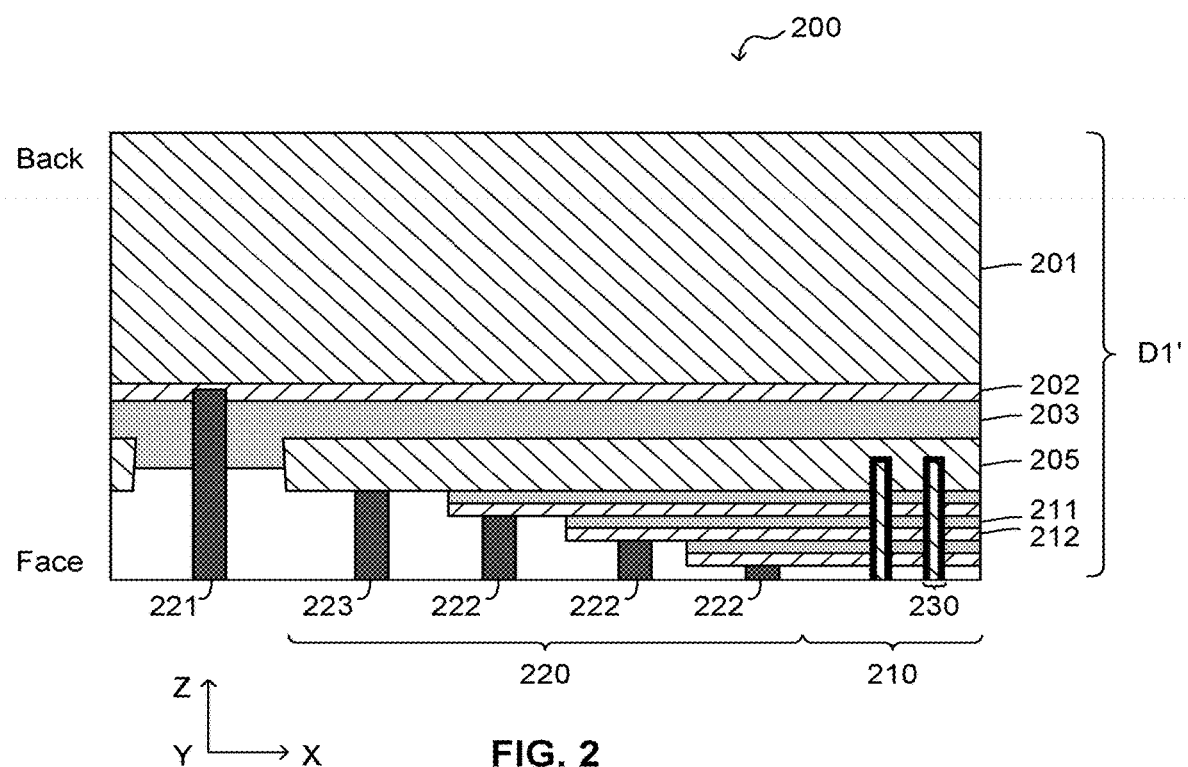
FIGS. 2-8 are cross-sectional views of a semiconductor device at various intermediate steps of manufacturing, in accordance with exemplary embodiments of the disclosure.

FIG. 2 shows a cross-sectional view of a semiconductor device 200 that will eventually become the device 100. It should be understood that FIG. 2 only shows a portion of the device 200. Similar to the device 100, the device 200 can include a first die D1', which corresponds to the first die D1, and a second die (not shown), which corresponds to the second die D2, bonded together via a bonding interface (not shown), which corresponds to the bonding interface 140. For simplicity, the bonding structures 141 and the cap layer 106 of the first die D1 in FIG. 1 are omitted in FIG. 2.

As shown, the device 200 can include a substrate 201 (e.g., silicon) on a back side of the first die D1' and an etch stop layer 202 (e.g., silicon nitride) on a face side of the substrate 201. The device 200 can also include an insulating layer 203 layer (e.g., silicon oxide), which will eventually become the insulating layer 103 in FIG. 1, on the face side of the etch stop layer 202. In some embodiments, the etch stop layer 202 may not be necessary.

As illustrated in FIG. 2, the device 200 has components that are configured similarly to the corresponding components of the device 100 in FIG. 1. For example, a first contact structure 221, a semiconductor layer 205, a stack of alternating insulating layers 211 and word line layers 212, an array region 210, a staircase region 220, a channel structure 230, a plurality of second contact structures 222, and a third contact structure 223 are configured similarly to the first contact structure 121, the semiconductor layer 105, the stack of alternating insulating layers 111 and word line layers 112, the array region 110, the staircase region 120, the channel structure 130, the plurality of second contact structures 122, and the third contact structure 123, respectively. The descriptions of these components have been provided above and will be omitted here for clarity purpose.

Figure 3:
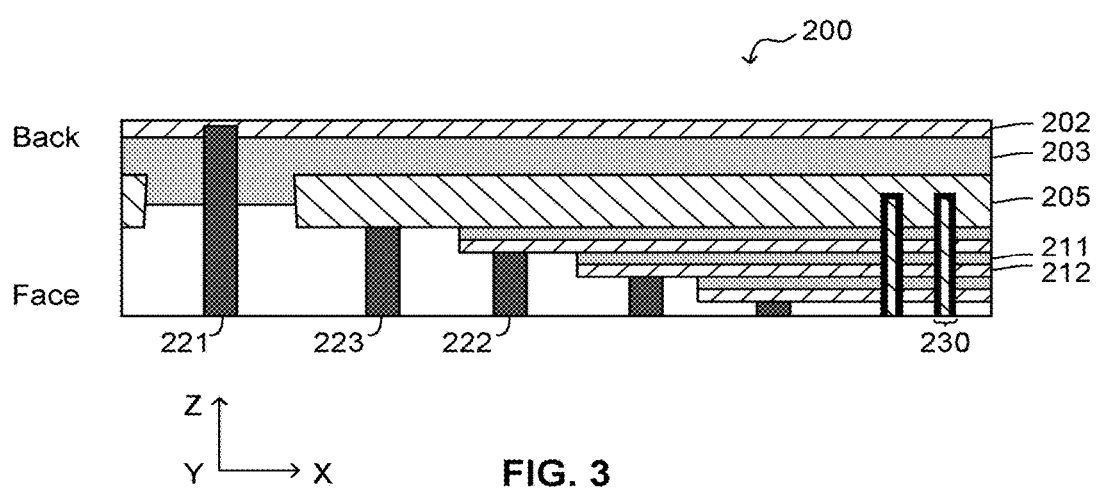

FIG. 3 shows the device 200 in FIG. 2 after the substrate 201 is removed from the back side. Removal of the substrate 201 can be accomplished by chemical mechanical polishing (CMP) and/or wet etching. The etch stop layer 202 can be used to determine when the CMP and/or wet etching process should stop.

Figure 4:
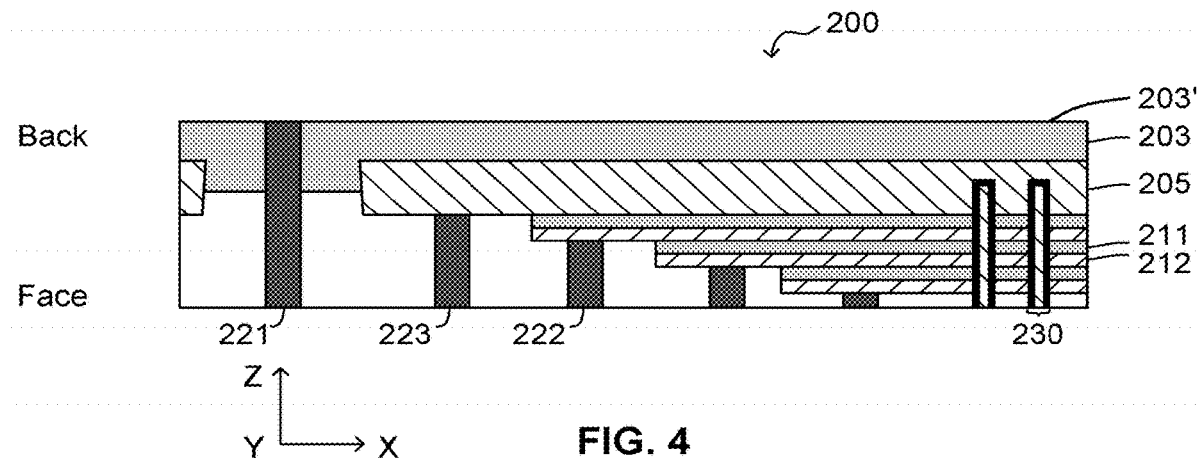

FIG. 4 shows the device 200 in FIG. 3 after the etch stop layer 202 and a portion of the first contact structure 221 is removed. Consequently, the remaining first contact structure 221 and the insulating layer 203 are exposed from the back side. Similar to FIG. 3, removal of the etch stop layer 202 and the portion of the first contact structure 221 can be accomplished by a CMP process. Alternatively, the etch stop layer 202 can be removed by a first etching process, and the portion of the first contact structure 221 can be removed by a second etching process. In some embodiments, removal of the portion of the first contact structure 221 may not be necessary. As a result, the portion of the first contact structure 221 will be exposed (not shown). Further, while shown to extend into the etch stop layer 202, the first contact structure 221, in some embodiments, only extends to a back surface 203' of the insulating layer 203 (not shown). Therefore, removal of any portion of the first contact structure 221 may not be necessary.

Figure 5:
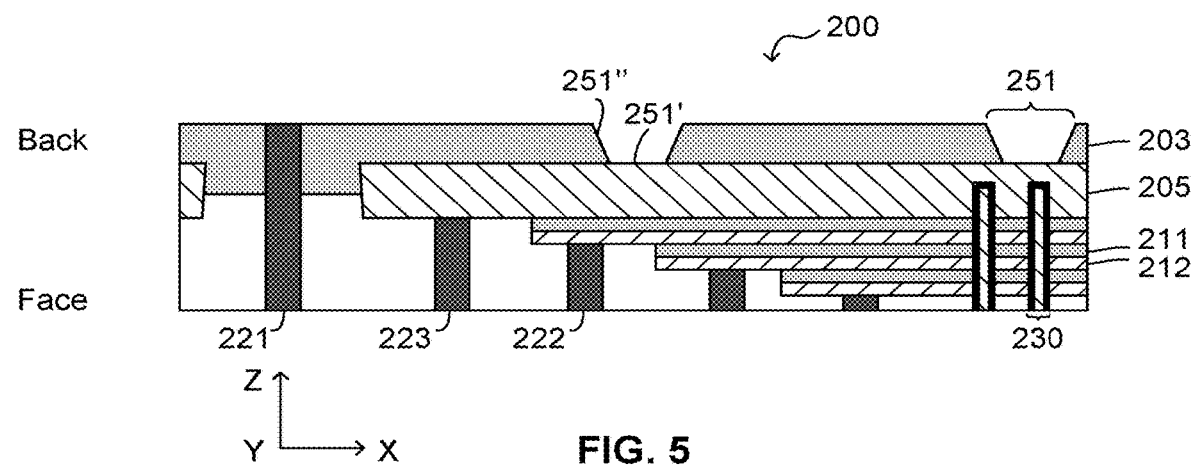

In FIG. 5, contact holes 251 can be formed in the insulating layer 203 of the device 200 so that a portion of the semiconductor layer 205 is exposed. A contact hole 251 can have a bottom 251' and two sidewalls 251". In the FIG. 5 example, two contact holes 251 are shown to have a trapezoid shape in cross-section that expands from the face side to the back side. It is understood that any number of contact holes 251 can be formed and that the contact holes 251 can have other shapes, such as a rectangle shape. The contact holes 251 can be formed by an etching process using a photoresist as an etching mask defined by a photolithography process.

Figure 6:
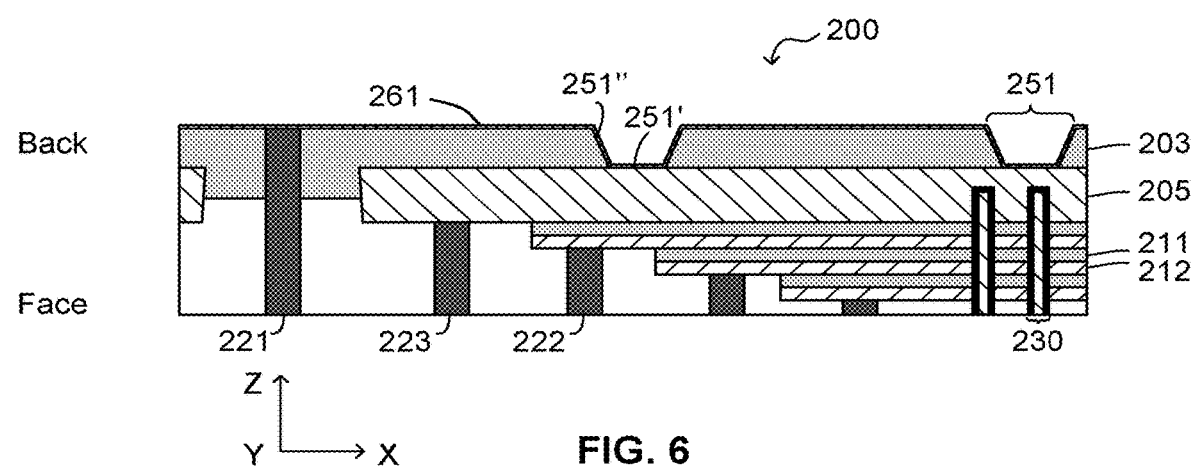

In FIG. 6, a second conductive layer 261 that will eventually become the second conductive layer 161 in FIG. 1 can be formed to conformally coat the exposed first contact structure 221, the insulating layer 203, and the exposed portion of the semiconductor layer 205. As a result, the second conductive layer 261 covers the bottoms 251' and sidewalls 251" of the contact holes 251. The second conductive layer 261 can be made of titanium and formed by chemical vapor deposition. The second conductive layer 261 can be have a thickness in the range of 10-20 nm. In some embodiments, the second conductive layer 261 may not be necessary so this step can be skipped.

Figure 7:
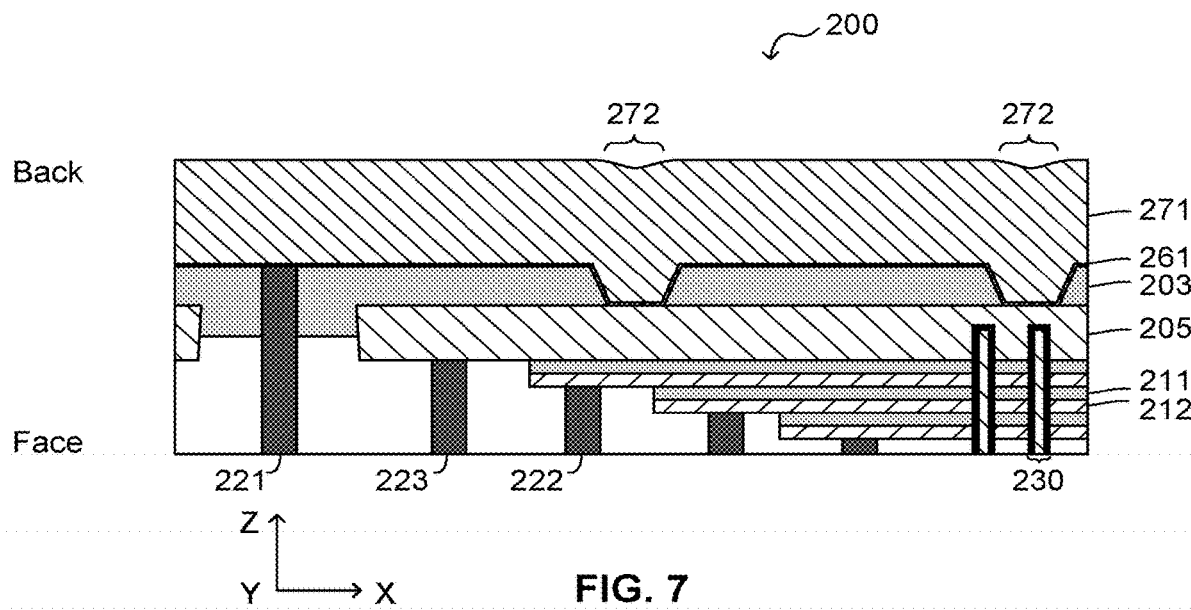

In FIG. 7, a first conductive layer 271 that will eventually become the first conductive layer 171 in FIG. 1 can be formed over the second conductive layer 261 from the back side so that the contact holes 251 can be filled with the first conductive layer 271. The first conductive layer 271 can be a conductive layer made of aluminum and formed by chemical vapor deposition. In an example where the second conductive layer 261 is titanium and the semiconductor layer 205 is polysilicon, titanium can be an adhesion layer between aluminum and polysilicon. Additionally, recess structures 272 can be formed on the back side of the first conductive layer 271 as a result of the contact holes 251.

Figure 8:
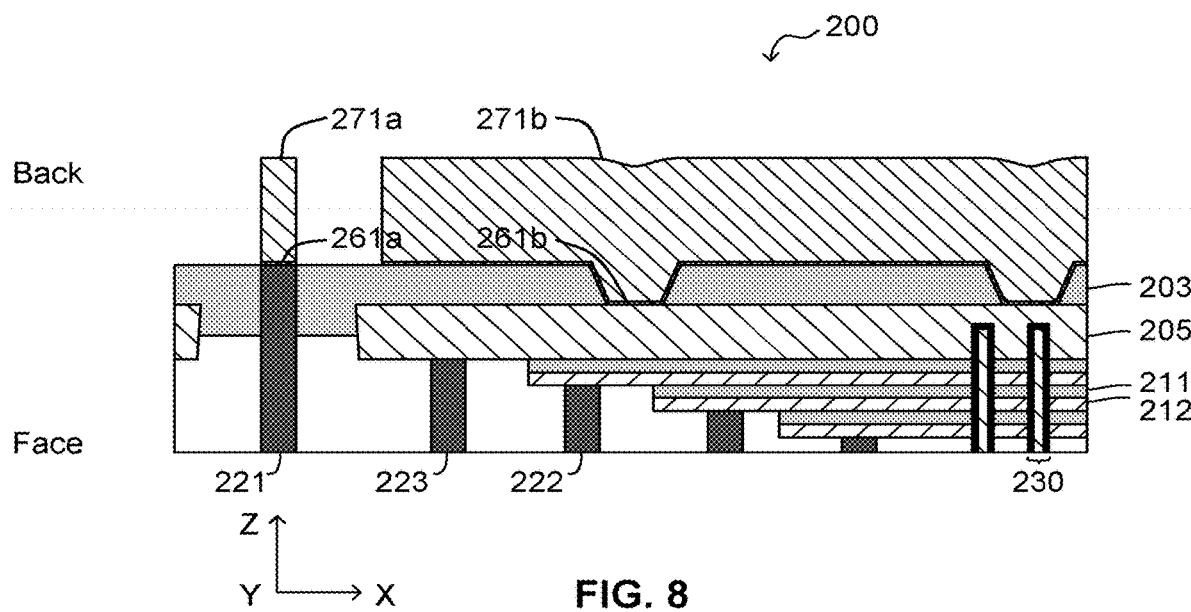

FIG. 8 shows the device 100 in FIG. 7 after removing portions of the first conductive layer 271 and portions of the second conductive layer 261. Removal of the portions of the first conductive layer 271 and the portions of the second conductive layer 261 can be accomplished by etching with photoresist and/or hard mask layers. Consequently, a first portion of the first conductive layer 271a can be disposed over a first portion of the second conductive layer 261a to form a first pad-out structure, and a second portion of the first conductive layer 271b can be disposed over a second portion of the second conductive layer 261b to form a second pad-out structure. Similar to the device 100, external circuitry (not shown) can provide a control signal to and receive data from peripheral circuitry (not shown) of the second die D2' of the device 200 via the first pad-out structure (271a and 261a) that is coupled with the peripheral circuitry via the first contact structure 221. The peripheral circuitry can then interact with the transistors of the first die D1'.

Figure 9:
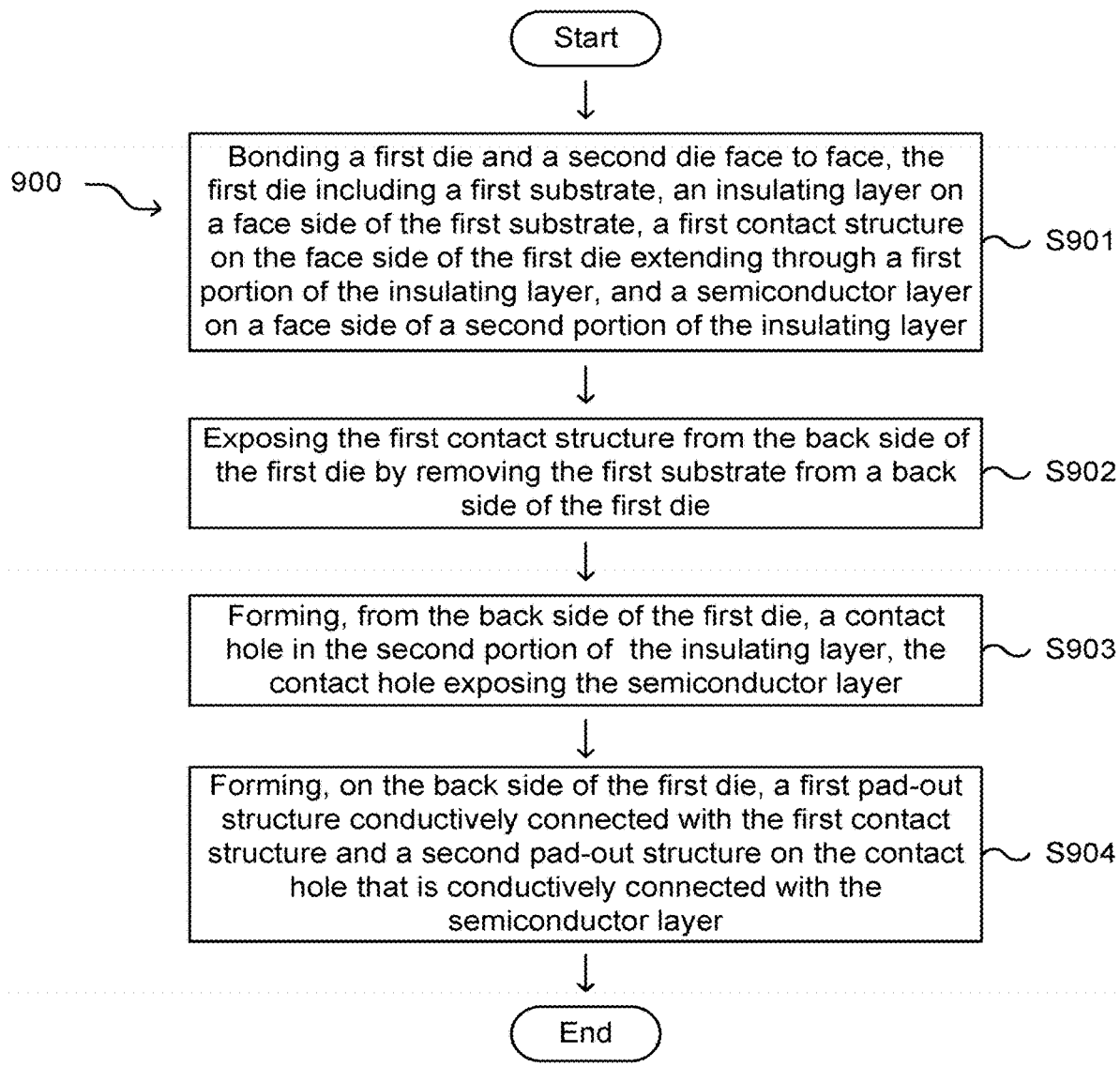
FIG. 9 is a flow chart of an exemplary process for manufacturing an exemplary semiconductor device, in accordance with embodiments of the disclosure.

FIG. 9 is a flow chart of an exemplary process 900 for manufacturing an exemplary semiconductor device, such as the device 100 in FIG. 1, the device 200 in FIG. 8, and the like, in accordance with embodiments of the disclosure. The process 900 starts with step S901 where a first die and a second die is bonded face to face (a circuitry side is face, and a substrate side is back). The first die can include a first substrate, first transistors formed on a face side of the first die in a semiconductor layer with an insulating layer between the first substrate and the semiconductor layer, and a first contact structure on the face side of the first die that extends through the insulating layer. The second die can include a second substrate with structures formed on a face side of the second die.

In order to bond the first die to the second die, a plurality of first bonding structures, such as pillars, can be formed on the face side of the first die, and a plurality of second bonding structures can be formed on the face side of the second die. The bonding structures can include Cu, Ni, and SnAg. The bonding process can be operated at a temperature over 220° C. for the bonding structures to melt so that a first bonding structure can form a connection with a corresponding second bonding structure. Consequently, the first transistors in the first die can be coupled with structures in the second die via corresponding bonding structures at the bonding interface and contact structures in the two dies.

Further, the first transistors can form vertical memory cell strings, and the second die can include peripheral circuitry as shown in the FIG. 1 example. In alternative embodiments, the first transistors can include peripheral circuitry, and the second die can include memory cells.

At step S902, the first substrate is removed from the back side of the first die to expose the first contact structure from the back side of the first die. As a result, the insulating layer is also exposed from the back side of the first die. In an example where an etch stop layer is sandwiched between the first substrate and the insulating layer, the etch stop layer can also be removed from the back side of the first die. Removal of the first substrate and etch stop layer can be accomplished by CMP and/or etching.

At step S903, a contact hole that exposes a portion of the semiconductor layer is formed in the insulating layer from the back side of the first die. The contact hole has a bottom and two sidewalls. Photolithography technology can be used to define a channel hole pattern in photoresist and/or hard mask layers, and etch technology can be used to transfer the pattern to the insulating layer and then remove the photoresist and/or hard mask layers.

At step S904, a first pad-out structure and a second pad-out structure can be formed on the back side of the first die by two deposition processes, a photolithography process, and two etching processes. To begin with, a conformal liner layer can be formed by a first deposition process so that the liner layer covers the exposed first contact structure, the insulating layer, and the exposed portion of the semiconductor layer. The liner layer can also cover the bottom and sidewalls of the contact hole. Then, a pad layer can be formed over the liner layer from the back side by a second deposition process. The pad layer can fill the contact hole and form a recess structure on the back side as a result of the contact hole. Subsequently, a photolithography process can be performed to define a pad-out pattern of photoresist and/or hard mask layers that serve as an etching mask. Next, two etching processes can be performed to transfer the pad-out pattern to the pad layer and the liner layer to form the first pad-out structure and the second pad-out structure. In some embodiments, the two etching processes can be replaced by a single etching process. Additionally, the photoresist and/or hard mask layers will be removed.

As a result, the first pad-out structure is conductively connected to the first contact structure, with a first portion of the liner layer sandwiched in between. External circuitry can be coupled with the peripheral circuitry of the device via the first pad-out structure and the first contact structure. Similarly, the second pad-out structure is formed on the contact hole and conductively connected to the semiconductor layer, with a second portion of the liner layer sandwiched in between. The second pad-out structure can be configured to provide a common source array for the memory cells.

Further, in an example where the pad-out structures are aluminum and the semiconductor layer is polysilicon, the liner layer can be made of an adhesion material, such as titanium. In other examples, the pad-out structures can be made of other conductive materials, and the liner layer can be a barrier layer, a seed layer, and/or an adhesion layer. The liner layer can also be used to reduce contact resistance. In some embodiments, the liner layer may not be necessary.

It should be noted that additional steps can be provided before, during, and after the process 900, and some of the steps described can be replaced, eliminated, or performed in a different order for additional embodiments of the process 900. For example, formation of the liner layer may not be necessary. At step S904 in particular, the pad layer having a recess structure can be planarized by a CMP process, prior to the photolithography process that defines the etching mask. Consequently, the pad-out structures will have flat surfaces on the back side. Additionally, a lift-off process where a photolithography process is performed prior to deposition of the liner layer and the pad layer can also be used to form the pad-out structures.

The various embodiments described herein offer several advantages. For example, in related 3D NAND memory devices, pad-out structures are formed in a TSC configuration, which requires deposition and etching of interlayer dielectrics (e.g., silicon oxide, silicon nitride, and so on) and TSC metals (e.g., tungsten) on the back side of the first substrate. The disclosed method can simplify the manufacturing process and form non-TSC pad-out structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor device, comprising:

bonding a first die and a second die face to face, the first die including a first substrate, an insulating layer on a face side of the first substrate, a first contact structure on the face side of the first die extending through a first portion of the insulating layer, and a semiconductor layer on a face side of a second portion of the insulating layer, a portion of the insulating layer being disposed between the first contact structure and the semiconductor layer, and the portion of the insulating layer being in direct contact with the first contact structure and a side surface of the semiconductor layer that faces the first contact structure;

exposing the first contact structure from a back side of the first die by removing the first substrate from the back side of the first die;

forming, from the back side of the first die, a contact hole in the second portion of the insulating layer, the contact hole exposing the semiconductor layer; and forming, on the back side of the first die, a first pad-out structure conductively connected with the first contact structure and a second pad-out structure on the contact hole that is conductively connected with the semiconductor layer.

2. The method of claim 1, wherein forming the first pad-out structure and the second pad-out structure further comprises:

forming, from the back side of the first die, a first conductive layer over the first contact structure and the semiconductor layer, the first conductive layer filling the contact hole; and patterning, from the back side of the first die, the first conductive layer to form the first pad-out structure conductively connected with the first contact structure and the second pad-out structure conductive connected with the semiconductor layer.

3. The method of claim 2, wherein forming the first pad-out structure and the second pad-out structure further comprises:

forming a second conductive layer on a back side of the insulating layer, the second conductive layer interfacing the first conductive layer and the first contact structure and interfacing the first conductive layer and the semiconductor layer; and patterning the second conductive layer using a same photomask as the first conductive layer.

4. The method of claim 3, wherein:

the first conductive layer is made of a first metal material; and the second conductive layer is made of a second metal material.

5. The method of claim 4, wherein:

the first conductive layer comprises at least aluminum; and the second conductive layer comprises at least titanium.

6. The method of claim 1, wherein exposing the first contact structure from the back side of the first die further comprises:
removing an etch stop layer after removing the first substrate, the etch stop layer being sandwiched between the first substrate and the insulating layer.

7. The method of claim 1, wherein:
the first die further includes memory cells formed on the face side of the semiconductor layer; and
the second die includes peripheral circuitry for the memory cells on a face side of a second substrate.

8. The method of claim 7, wherein bonding the first die and the second die face to face further comprises:
bonding a first bonding structure connected with the first contact structure in the first die with a second bonding structure connected to an input/output circuit in the peripheral circuitry in the second die.

9. The method of claim 7, wherein the second pad-out structure is configured to provide an array common source for the memory cells.

10. The method of claim 1, wherein:
the second die includes memory cells disposed on the face side of the second die; and
the first die further includes peripheral circuitry for the memory cells.

11. A semiconductor device, comprising:
a first die and a second die bonded face to face, the first die including an insulating layer on a back side of the first die, a first contact structure extending from a face side of the first die through a first portion of the insulating layer, a semiconductor layer on a face side of a second portion of the insulating layer, and first transistors formed on a face side of the semiconductor layer, a portion of the insulating layer being disposed between the first contact structure and the semiconductor layer, and the portion of the insulating layer being in direct contact with the first contact structure and a side surface of the semiconductor layer that faces the first contact structure;
a first pad-out structure disposed on the back side of the first die, the first pad-out structure being electrically coupled with the first contact structure; and
a second pad-out structure disposed on the back side of the first die, the second pad-out structure being electrically coupled with the semiconductor layer.

12. The semiconductor device of claim 11, wherein:
the first transistors include memory cells formed over the semiconductor layer on the face side of the first die; and
the second die includes a substrate and peripheral circuitry that is formed on the face side of the substrate for the memory cells.

13. The semiconductor device of claim 12, wherein the memory cells comprise:
a stack of alternating word line layers and insulating layers; and
a plurality of channel structures extending through the stack, a channel structure including a channel layer surrounded by one or more insulating layer.

14. The semiconductor device of claim 13, wherein:
the first die further includes a plurality of contact structures formed in a staircase region of the stack, the plurality of contact structures being coupled with the word line layers, the staircase region being on a boundary or in a middle of the stack.

15. The semiconductor device of claim 12, wherein:
the first pad-out structure is coupled with an input/output circuit of the peripheral circuitry via the first contact structure, a bonding interface between the first die and the second die, and a corresponding second contact structure in the second die; and
the peripheral circuitry is coupled with the memory cells via corresponding third contact structures in the first die, the bonding interface, and corresponding fourth contact structures in the second die.

16. The semiconductor device of claim 12, wherein the second pad-out structure is configured to provide an array common source for the memory cells.

17. The semiconductor device of claim 11, wherein:
the second die further includes memory cells formed on a face side of a substrate;
the first transistors include peripheral circuitry, formed on the face side of the first die, for the memory cells;
the first pad-out structure is coupled with an input/output circuit of the peripheral circuitry via the first contact structure; and
the peripheral circuitry is coupled with the memory cells via corresponding contact structures in the first die, a bonding interface between the first die and the second die, and corresponding contact structures in the second die.

18. The semiconductor device of claim 11, wherein:
the first pad-out structure includes a first portion of a first conductive layer;
the second pad-out structure includes a second portion of the first conductive layer;
the first portion of the first conductive layer is spaced apart from the second portion of the first conductive layer; and
the first conductive layer is made of a first metal material.

19. The semiconductor device of claim 18, wherein:
the first pad-out structure further includes a first portion of a second conductive layer disposed between the first contact structure and the first portion of the first conductive layer;
the second pad-out structure further includes a second portion of the second conductive layer disposed between the semiconductor layer and the second portion of the second conductive layer;
the first portion of the second conductive layer is spaced apart from the second portion of the second conductive layer; and
the second conductive layer is made of a second metal material.

20. The semiconductor device of claim 19, wherein:
the first metal material is made of aluminum; and
the second metal material is made of titanium.

* * * * *